United States Patent
Kondo

(10) Patent No.: US 10,132,867 B1
(45) Date of Patent: Nov. 20, 2018

(54) METHODS AND APPARATUS FOR MEASURING BATTERY CHARACTERISTICS

(71) Applicant: SEMICONDUCTOR COMPONENTS INDUSTRIES, LLC, Phoenix, AZ (US)

(72) Inventor: Hideo Kondo, Ora-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/594,959

(22) Filed: May 15, 2017

(51) Int. Cl.
| H02J 7/00 | (2006.01) |
| G01R 31/36 | (2006.01) |
| H01M 10/48 | (2006.01) |
| H01M 10/0525 | (2010.01) |

(52) U.S. Cl.
CPC ..... *G01R 31/3606* (2013.01); *G01R 31/3627* (2013.01); *G01R 31/3662* (2013.01); *G01R 31/3679* (2013.01); *H01M 10/0525* (2013.01); *H01M 10/48* (2013.01)

(58) Field of Classification Search
CPC .................................................. G01R 31/3606
USPC ....................................................... 320/134
See application file for complete search history.

(56) References Cited

U.S. PATENT DOCUMENTS

| 2003/0102845 A1* | 6/2003 | Aker .................... H02J 7/0042 320/139 |
| 2004/0164702 A1* | 8/2004 | Holmes ............... H01M 16/006 320/101 |
| 2005/0046387 A1* | 3/2005 | Aker .................... H02J 7/0042 320/125 |
| 2010/0030499 A1 | 2/2010 | Kawahara |
| 2012/0223670 A1 | 9/2012 | Kinjo |
| 2014/0333265 A1 | 11/2014 | Kinjo |
| 2015/0070024 A1 | 3/2015 | Kim |
| 2015/0160302 A1 | 6/2015 | Ku |
| 2015/0301122 A1 | 10/2015 | Lee |
| 2016/0006282 A1* | 1/2016 | Winkler ................ H02J 7/0004 320/150 |
| 2016/0097819 A1 | 4/2016 | Ohkawa |
| 2016/0327613 A1 | 11/2016 | Kenmyo |
| 2016/0344068 A1 | 11/2016 | Kim |
| 2016/0372935 A1 | 12/2016 | Sakata |

\* cited by examiner

*Primary Examiner* — Suresh Memula
(74) *Attorney, Agent, or Firm* — The Noblitt Group, PLLC; Hettie L. Haines

(57) ABSTRACT

Various embodiments of the present technology comprise a method and apparatus for measuring battery characteristics. In various embodiments, the apparatus comprises a lithium ion battery and a fuel gauge circuit to monitor the resistance, the capacity, and the state of health of the battery as it ages. The fuel gauge circuit utilizes the resistance values and capacity values to compute a state of health (SOH) value. The fuel gauge circuit primes the battery prior to computing the SOH value, wherein priming the battery comprises a sequence of charging, relaxing, and discharging the battery.

20 Claims, 7 Drawing Sheets

METHODS AND APPARATUS FOR MEASURING BATTERY CHARACTERISTICS

BACKGROUND OF THE TECHNOLOGY

"Battery capacity" is a measure (typically in ampere-hours) of the charge stored by the battery, and is determined by the mass of active material contained in the battery. The battery capacity represents the maximum amount of energy that can be extracted from the battery under certain specified conditions.

The effective storage capacity of the battery, however, diminishes with age and undergoes irreversible damage. This damage is caused by various mechanisms including corrosion and other chemical processes, and aging of the internal battery components contributes to the damage as well. As individual plates of the cells corrode, their operational surface area diminishes and the electrolyte undergoes chemical changes, causing them both to be less chemically reactive. These changes reduce the volume of reactive components in the cell, reducing the charge capacity of the cell while also increasing the internal resistance of the cell, as the corrosion products inhibit the free flow of electrons through the plates. Each charge/discharge cycle of the battery also has a similar effect but at an accelerated rate. The end result is that as the battery ages and deteriorates, the effective capacity of the battery decreases, reducing the amount of time the battery can supply power to a device.

One indicator of the battery's ability to retain charge and ability to power a device is the battery "state of health." Many applications use this parameter to estimate battery performance, for example the "run-time" of the battery, which reflects the amount of time the battery will continue to provide power before it dies. An accurate estimate of the run-time is desired to provide alerts to a user.

SUMMARY OF THE INVENTION

Various embodiments of the present technology comprise a method and apparatus for measuring battery characteristics. In various embodiments, the apparatus comprises a lithium ion battery and a fuel gauge circuit to monitor the resistance, the capacity, and the state of health of the battery as it ages. The fuel gauge circuit utilizes the resistance and capacity to compute a state of health (SOH) value. The fuel gauge circuit primes the battery prior to computing an SOH value for a more accurate SOH value, wherein priming the battery comprises a sequence of charging, relaxing, and discharging the battery.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, memory devices, semiconductor devices, such as transistors and capacitors, and the like, which may carry out a variety of functions. In addition, the present technology may be practiced in conjunction with any number of systems, such as automotive, aerospace, medical, scientific, surveillance, and consumer electronics, and the systems described are merely exemplary applications for the technology. Further, the present technology may employ any number of conventional techniques for measuring voltage, measuring current, measuring temperature, carrying out various mathematical computations, and the like.

Figure 1:
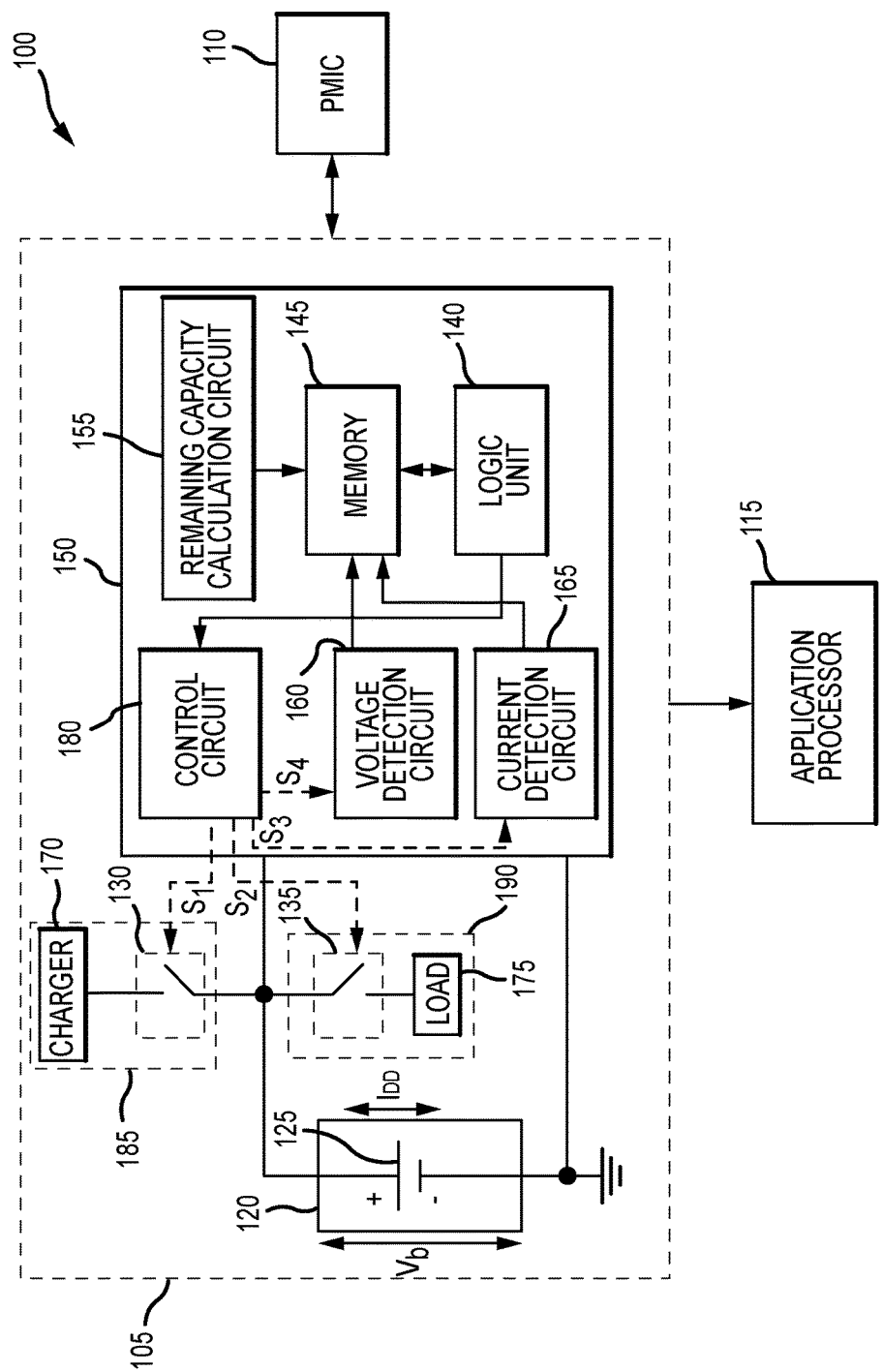
FIG. 1 is a block diagram of an electronic system in accordance with an exemplary embodiment of the present technology.

Methods and apparatus for measuring a state of health (SOH) of a battery according to various aspects of the present technology may operate in conjunction with any suitable electronic system and/or device, such as "smart devices," wearables, consumer electronics, portable devices, battery-powered vehicles, and the like. Referring to FIG. 1, an exemplary system 100 may be incorporated into an electronic device powered by a rechargeable battery, such as a lithium ion battery. For example, in various embodiments, the system 100 may comprise a battery system 105, an application processor 115, and a power management IC (PMIC) 110, that operate together to provide suitable power levels to the electronic device.

The battery system 105 provides power and battery information to various components of the electronic device, such as the application processor 115 and the PMIC 110. The battery system 105 may be electrically or communicatively coupled by any suitable method to allow the batter system 105 to transmit data and/or battery information to and from the PMIC 110 and/or the application processor. The battery information may comprise any suitable criteria, such as a capacity of the battery, a run-time of the battery, and the like.

The battery system 105 may comprise any suitable device or system for providing power and battery information. For example, in an exemplary embodiment, the battery system 105 may comprise a battery pack 120, a switchable charger 185, a switchable load 190, and a fuel gauge circuit 150. In various embodiments, the system 100 may further comprise a timing unit (not shown) to operate various circuits according to a predetermined timing cycle.

The battery pack 120 may supply power to the system 100, and may comprise a battery 125, such as a rechargeable lithium ion (Li-ion) battery, a nickel-metal-hydride battery (NiMH), a nickel-cadmium (NiCd) battery, a lithium-ion polymer (LiPo) battery, and the like. In an exemplary embodiment, the battery 125 generates a voltage $V_b$ between a negative electrode and a positive electrode of the battery 125.

The battery pack 120 may also comprise a temperature sensor (not shown) that provides a signal according to the temperature of the battery 125. The temperature sensor may comprise a thermistor (not shown) that generates a thermistor voltage which corresponds to a temperature of the battery 125. The temperature sensor may, however, comprise any appropriate sensor or other device or system for generating a signal corresponding to the temperature of the battery 125.

The switchable charger 185 may be configured to selectively couple to and charge the battery 125. The switchable charger 185 may comprise any suitable device and/or system to generate a current $I_{DD}$ to charge the battery 125. For example, the switchable charger 185 may comprise a charger 170 and a first switch 130. The first switch 130 may operate according to a first control signal S1 from the fuel gauge circuit 150. For example, the first control signal S1 may open the first switch 130 to disconnect the battery 125 from the charger 170, and close the first switch 130 to connect the battery 125 to the charger 170.

The switchable load 190 may be configured to selectively couple to the battery 125 to discharge the battery 125. The switchable load 190 may comprise any suitable device and/or system to draw a current $I_{DD}$ from the battery 125. For example, the switchable load 190 may comprise a load 175 and a second switch 135. The second switch 135 may operate according to a second control signal S2 from the fuel gauge circuit 150. The second control signal S2 may open the second switch 135 to disconnect the battery 125 from the load 175, and close the second switch 135 to connect the battery 125 to the load 175.

The fuel gauge circuit 150 may be configured to receive various inputs, monitor the battery capacity, and determine the SOH for the battery 125. The fuel gauge circuit 150 may receive signals corresponding to various system data, such as a temperature signal from the temperature sensor and/or control signals, such as from the PMIC 110. The fuel gauge circuit 150 may also generate various types of control signals in response to received input signals or the determined SOH for the battery, such as control signals to control charging, discharging, and relaxation periods, and signals corresponding to the SOH of the battery 125. The fuel gauge circuit 150 may further be configured to measure various parameters of the battery 125 such as: the voltage $V_b$, the current $I_{DD}$, and remaining capacity (also expressed as an RSOC).

The fuel gauge circuit 150 may also be configured to perform various computations. The fuel gauge circuit 150 may comprise any number of suitable circuits and/or systems and may be implemented in any suitable manner, such as in the form of a large scale integrated (LSI) circuit. For example, in one embodiment, the fuel gauge circuit 150 may comprise a control circuit 180, a voltage detection circuit 160, a current detection circuit 165, a capacity calculation circuit 155, a logic unit 140, and a memory 145.

In various embodiments, the fuel gauge circuit 150 may further comprise a timer (not shown) to track and measure a time interval (period of time). For example, the timer may be utilized to facilitate integration of a current $I_{DD}$ over a predetermined period of time and/or may be used to track periods of charging, discharging, and an open state (a state where the battery is neither charging nor discharging).

The control circuit 180 may be configured to transmit various control signals to activate and/or operate various devices and/or sub-systems within the battery system 105. For example, the control circuit 180 may be communicatively coupled to the switchable charger 185 and to the switchable load 190. The control circuit 180 may transmit the first control signal S1 to selectively couple/decouple the switchable charger 185 to/from the battery 125. Similarly, the control circuit 180 may transmit the second control signal S2 to selectively couple/decouple the switchable load 190 to/from the battery 125. The control circuit 180 may be further configured to transmit a third control signal S3 to activate the current detection circuit 165 and a fourth control signal S4 to activate the voltage control circuit 160.

The voltage detection circuit 160 may be configured to detect and/or measure the voltage $V_b$ of the battery 125. The voltage detection circuit 160 may be coupled to the battery 125, such as a positive terminal (+) of the battery 125. The voltage detection circuit 160 may comprise any circuit and/or system suitable for detecting and/or measuring the voltage $V_b$. In an exemplary embodiment, the voltage detection circuit 160 may be coupled to the memory 145 and configured to transmit data, for example voltage data corresponding to the measured voltage $V_b$, to the memory 145 and/or to the logic unit 140. The voltage detection circuit 160 may detect and/or measure the voltage $V_b$ in response to the fourth control signal S4 from the control circuit 180.

The detection circuit 165 may be configured to detect and/or measure the current $I_{DD}$ of the battery 125. For example, the current detection circuit 165 may detect and measure a direction and a magnitude of the current $I_{DD}$. The current detection circuit 165 may be coupled to the battery 125 by any suitable method, such as to a positive terminal (+) of the battery 125. The current detection circuit 165 may comprise any circuit and/or system suitable for detecting and/or measuring the current $I_{DD}$. In an exemplary embodiment, the current detection circuit 165 may be coupled to the memory 145 and configured to transmit data, for example current data corresponding to the measured current $I_{DD}$, to the memory 145 and/or to the logic unit 140. The current detection circuit 165 may detect and/or measure the current $I_{DD}$ in response to the third control signal S3 from the control circuit 180.

The memory 145 may be suitably configured to store programs to be executed by the logic unit 140 and various types of battery characteristic data, such as original (new) battery specifications (e.g., original (full charge) capacity of a new battery and original resistance values), aged battery specifications (e.g., aged capacity and aged resistance values), and/or relational data between two variables (e.g., capacity-resistance ratio data, resistance-RSOC data, and OCV-RSOC data). For example, the memory 145 may comprise ROM (read only memory) and RAM (random access memory). A storage area of the memory 145 may comprise a program storage unit to store programs to operate the logic unit 140.

Figure 2:
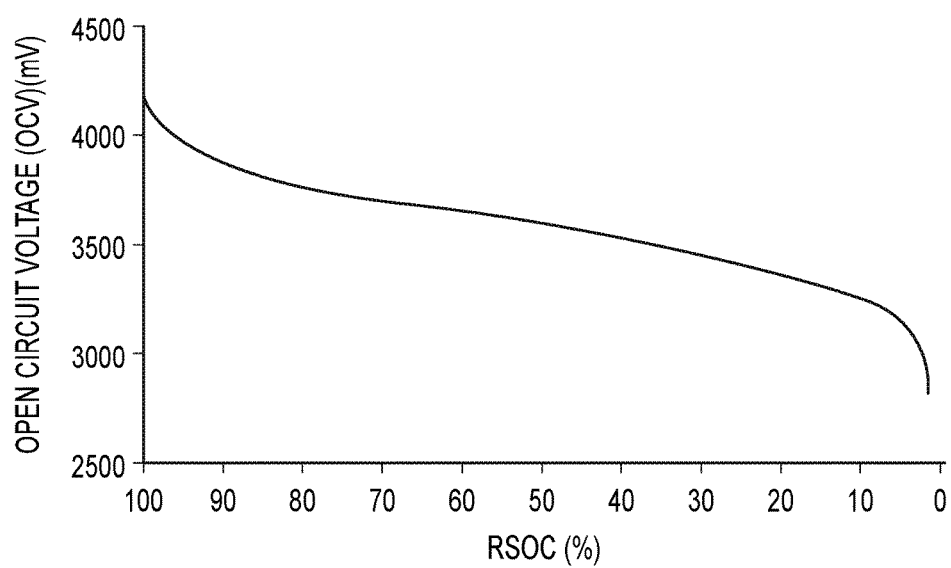
FIG. 2 is a graph illustrating a relationship between the battery voltage and relative state of charge of a battery in accordance with an exemplary embodiment of the present technology.
Figure 3:
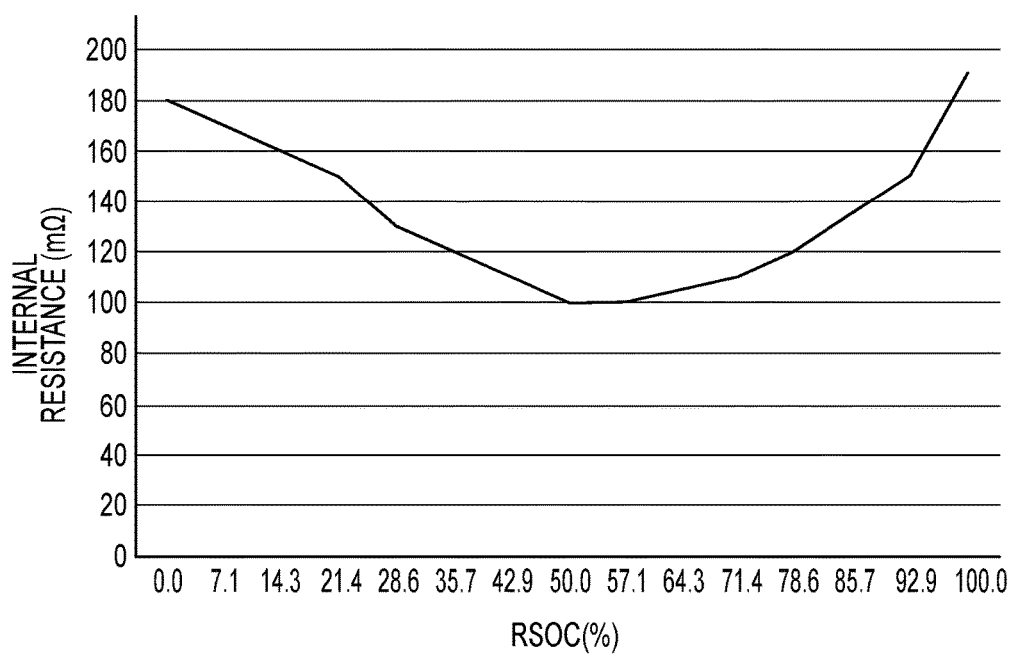
FIG. 3 is a graph illustrating a relationship between the internal resistance and relative state of charge of a new battery in accordance with an exemplary embodiment of the present technology.

The memory 145 may be configured to store various data points between two or more variables, such as in a look-up table or other suitable form. For example, and referring to FIGS. 2-4, the memory 145 may store data indicating a relationship between the voltage $V_b$ of the battery 125 and the remaining capacity (generally expressed in milli-ampere hours, mAh) of the battery 125 (i.e., OCV-RSOC data) (FIG. 2). In general, the remaining capacity of the battery may be expressed as a percentage, and is referred to as a relative state of charge (RSOC) of the battery 125.

Figure 4:
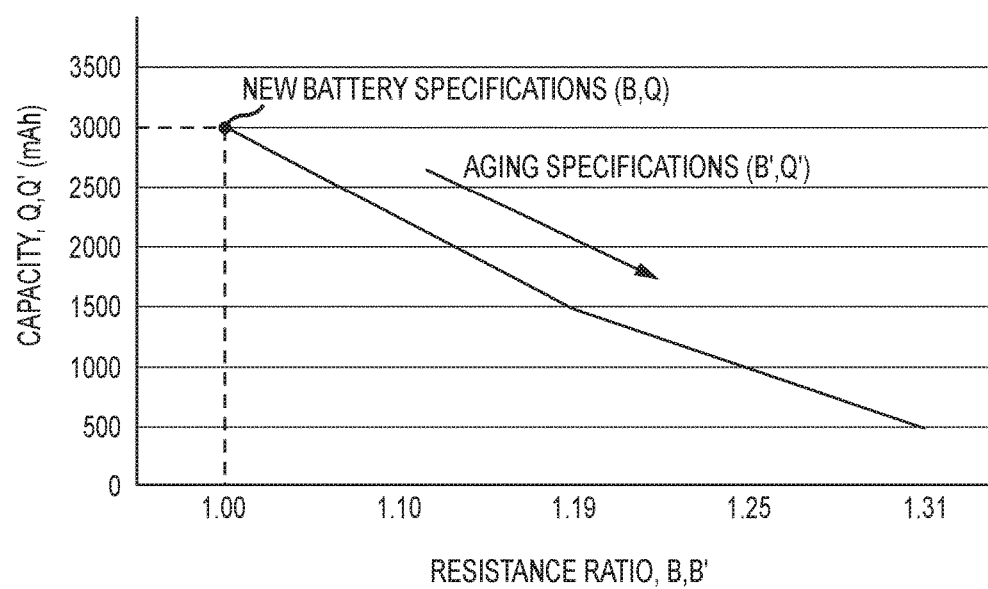
FIG. 4 is a graph illustrating a relationship between an effective capacity and a resistance ratio of an aging battery in accordance with an exemplary embodiment of the present technology.

Similarly, the memory 145 may store data indicating a relationship and/or correlation between the capacity of the battery 125 and a resistance ratio B of the battery 125 as the battery 125 ages (i.e., capacity-resistance ratio data) (FIG. 4). In general, as the battery 125 ages, the resistance ratio B increases and the capacity decreases. The capacity-resistance ratio data may further contain information related to the battery specifications when the battery 125 is new and has not aged. For example, a new battery will have a resistance ratio B equal to 1 and may have an original capacity Q equal to 3000 mAh. As the battery 125 ages, the resistance ratio may be referred to as an aged resistance ratio B' and the capacity may be referred to as an aged capacity Q'.

The OCV-RSOC data may comprise a characteristic curve of the battery according to various battery voltages and corresponding RSOC values during the open state. In general, the voltage $V_b$ during the open state is referred to as an open circuit voltage (OCV), and the characteristic curve may be referred to as an OCV curve. Therefore, the OCV-RSOC data may be utilized to determine an expected voltage (the OCV) according to a known RSOC (also referred to as expected battery characteristic data). For example, in one representative embodiment, if the RSOC is 20 percent, then the expected voltage is approximately 3500 mV.

The remaining capacity calculation circuit 155 may be suitably configured to determine the remaining capacity (or the RSOC, when expressed as a percent) of the battery 125. In one embodiment, the remaining capacity calculation circuit 155 may be configured to determine the remaining capacity by measuring the voltage $V_b$ of the battery 125. In general, utilizing the voltage $V_b$ of battery to determine the remaining capacity is referred to as "the voltage method." In another embodiment, the remaining capacity calculation circuit 155 may be configured to measure the in-and-out-flowing current $I_{DD}$ of the battery 125 over a period of time and reporting the accumulated charge. This may be accomplished with the use of a current shunt, such as a sense resistor (not shown) coupled to the negative terminal (−) of the battery 125, In the present embodiment, the remaining capacity calculation circuit 155 monitors the voltage across the sense resistor as the battery 125 charges and discharges as an indication of the current $I_{DD}$. The current $I_{DD}$ is then integrated over some period of time and reported as the remaining capacity (in mAh or as a percentage).

The remaining capacity calculation circuit 155 may further utilize other suitable parameters, such as a measured battery temperature, to adjust the remaining capacity accordingly. For example, if the remaining capacity is 1,650 mAh, the value 1,650 mAh may be increased or decreased based on the temperature of the battery 125. In general, as the temperature of the battery increases, the battery capacity also increases.

The logic unit 140 may control the fuel gauge circuit 150 and realize various functions by executing various programs stored in the memory 145. The logic unit 140 may further be configured to perform various calculations, extract data from the memory 145, and/or receive relevant data needed to perform the calculations, such as a measured voltage $V_b$ and/or a measured current $I_{DD}$ of the battery 125. The logic unit 140 may comprise any suitable devices and/or systems, and may be realized by the use of software, hardware, or a combination thereof.

For example, the logic unit 140 may be configured to compute the aged resistance R'. In an exemplary embodiment, the aged resistance R' is equal to a change in voltage ΔV divided by the measured current $I_{DD}$ according to the equation:

$$R' = \Delta V / I_{DD}. \quad \text{Eq. 1}$$

The logic unit may be further configured to compute the aged resistance ratio B'. In an exemplary embodiment, the aged resistance ratio B' is equal to the aged resistance R' divided by the original resistance R according to the equation:

$$B' = R'/R. \quad \text{Eq. 2}$$

The logic unit 140 may compute an SOH value according to the aged capacity Q' of the battery 125 and the original capacity Q. In an exemplary embodiment, the SOH value is equal to the aged capacity Q' divided by the original capacity Q, multiplied by 100 according to the equation:

$$\text{SOH} = Q'/Q * 100. \quad \text{Eq. 3}$$

The numerical SOH value may correspond to a particular SOH indicator of the battery 125.

The logic unit 140 may be further configured to extract data from the look-up tables, or other data storage schemes, stored in the memory 145. For example, the logic unit 140 may be configured to extract a first voltage V1 (the OCV) corresponding to a known RSOC, for example according to the data described in FIG. 2, extract a resistance corresponding to a known RSOC, for example according to the data described in FIG. 3, and/or extract a capacity value corresponding to the aged resistance ratio B', for example according to the data described in FIG. 4.

The logic unit 140 may further interpret the SOH value and generate an appropriate indicator, such as an indicator light, message, signal, and the like, to inform the user of the SOH of the battery 125. The logic unit 140 may interpret the SOH value to indicate the run-time of the battery 125, and/or the overall remaining life of the battery 125. For example, the logic unit 140 may be adapted to provide an indication to the user whether the battery 125 is in excellent, good, declining, or bad health. The logic unit 140 may further provide some instruction or message to the user to take some specific action, such as generating an indicator to replace the battery 125. In general, the SOH value may be used to indicate the overall SOH of the battery 125. For example, if the SOH value equals 50%, this means that the battery 125 has lost 50% of its charge capacity and the logic unit 140 may interpret this value as a battery with a declining state of health and indicate to the user that the battery 125 should be replaced.

The application processor 115 may control the electronic device, for example based on a control signal received from the battery system 105. Further, the application processor 115 may transfer data outputted from the battery system 105 to a drive circuit (not shown), which may be configured to drive a display unit within the electronic device. The drive circuit may drive the display unit so that the remaining battery capacity, the temperature of the battery, the run-time of the battery, the SOH of the battery, and the like, can be displayed on the display unit based on the data from the application processor 115.

The PMIC 110 may manage the power requirements for the application processor 115, the fuel gauge circuit 150, and/or the battery 125. The PMIC 110 may be coupled to the battery system 105 to ensure that the battery 125 is operating according to a particular set of specifications and to ensure that the battery 125 is providing an appropriate amount of power to the application processor 115. For example, the PMIC 110 may manage the battery operating states, perform DC to DC conversion, perform voltage scaling, perform power sequencing, perform power-source selection, and/or other miscellaneous functions. The PMIC 110 may comprise any circuit and/or system suitable for battery management, voltage regulation, charging functions, and the like. The PMIC 110 may further comprise a memory device, similar to the memory 145, to store configuration data.

In operation, the fuel gauge circuit 150 may perform a health check of the battery 125 to determine the effects of aging on the battery capacity, the internal resistance of the battery, and the remaining life of the battery. The fuel gauge circuit 150 may prime the battery prior to computing the SOH value to ensure that the proper reference voltage is used to perform subsequent calculations.

In an exemplary operation, and referring to FIGS. 1-6, the fuel gauge circuit 150 may determine the remaining capacity of the battery 125 (500) according to any suitable method. In an exemplary embodiment, the fuel gauge circuit 150 measures the remaining capacity during a first open state. During the first open state, the battery 125 is neither charging nor discharging and may follow a charge period or a discharge period in the course of normal operation. The fuel gauge circuit 150 may utilize data stored in the memory 145 to determine corresponding variables. For example, the fuel gauge circuit 150 may extract an expected OCV (a first voltage V1) according to the remaining capacity (505) from the memory 145 using data points, such as data illustrated in FIG. 2. The fuel gauge circuit 150 may further utilize the remaining capacity to extract a correlated original resistance R (555) (also referred to as expected battery characteristic data) from the memory 145 using data points, such as data illustrated in FIG. 3.

The fuel gauge circuit 150 may then measure an actual voltage V2 (a second voltage) (510), for example by utilizing the voltage detection circuit 160, during the first open state. The actual voltage V2 measured during the first open state may also be referred to as the second voltage at T0 and the second voltage $V2_{T0}$). The fuel gauge circuit 150 may use the logic unit 140 to compare the first voltage V1 to the second voltage $V2_{T0}$ to determine if they are equal (515). In general, the first voltage V1 is not equal to the second voltage $V2_{T0}$ immediately after a charge or discharge period and a long open period is required before the voltage returns to the OCV level. If the first voltage V1 is equal to the second voltage $V2_{T0}$, then the fuel gauge circuit 150 may facilitate a discharge period (535) by operating the first and second switches 130, 135, measure a third (actual) voltage V3, measure the current $I_{DD}$ (545), and continue to compute the relevant variables to determine the SOH of the battery 125. If the second voltage $V2_{T0}$ is less than the first voltage V1, then the fuel gauge circuit 150 primes (520) the battery 125. If the second voltage $V2_{T0}$ is greater than the first voltage V1, then the actual second voltage $V2_{T0}$ is measured again (510). In various embodiments, the fuel gauge circuit 150 may apply a time delay (517) between the comparison of the first and second voltages V1, $V2_{T0}$ at step 516 and the re-measure of the actual second voltage $V2_{T0}$ at step 510. According to various embodiments, the time delay may be within a range of 10 ms to 100 ms, for example approximately 20 ms.

The fuel gauge circuit 150 may prime (520) the battery 125 by operating the first and second switches 130, 135 coupled to the charger 170 and the load 175 in a particular sequence to effect one of a charging period, a discharging period, and an open period. Priming (520) the battery 125 may comprise charging the battery 125 for a first time period T1 (also referred to as a charging period) (525). Charging the battery 125 may be accomplished by selectively coupling the charger 170 to the battery 125 via the first switch 130 and disconnecting the battery 125 from the load 175 by opening the second switch 135. The first time period T1 may be within a range of 10 ms to 1000 ms, for example approximately 50 ms.

Priming (520) the battery 125 may further comprise creating a second open state for a second time period T2 (also referred to as a second open period) (530). In an exemplary embodiment, the second time period T2 may be within a range of 10 ms to 1000 ms, for example approximately 100 ms. The second open state may be created by disconnecting the battery 125 from the charger 170 via the first switch 130 and disconnecting the battery 125 from the load 175 via the second switch 135. During the second open period the battery 125 is neither charging nor discharging (also referred to as "relaxing"). It is observed that during the second open period, the battery voltage returns to a reference voltage. In general, the reference voltage is the OCV of the battery 125, which varies according to the remaining capacity, as illustrated in FIG. 2.

Priming (520) the battery may further comprise discharging the battery for a third time period T3 (also referred to as a discharging period) (535). In an exemplary embodiment, the third time period T3 may be within a range of 10 ms to 1000 ms, for example approximately 50 ms. Discharging the battery 125 may be accomplished by selectively coupling the load 175 to the battery 125 via the second switch 135 and disconnecting the battery 125 from the charger 170 by opening the first switch 130. During the discharging period, the fuel gauge circuit 150 may measure a third voltage V3 (540). For example, the fuel gauge circuit 150 may employ the voltage detection circuit 160 to measure the voltage $V_b$. Substantially simultaneously, the fuel gauge circuit 150 may further employ the current detection circuit 165 to measure the current $I_{DD}$ of the battery 125 (545). In various embodiments, the measured voltage $V_b$ and current $I_{DD}$ may be transmitted to the memory 145 and stored. In other embodiments, the measured voltage $V_b$ and current $I_{DD}$ may be transmitted to the logic unit 140.

Figure 5A:
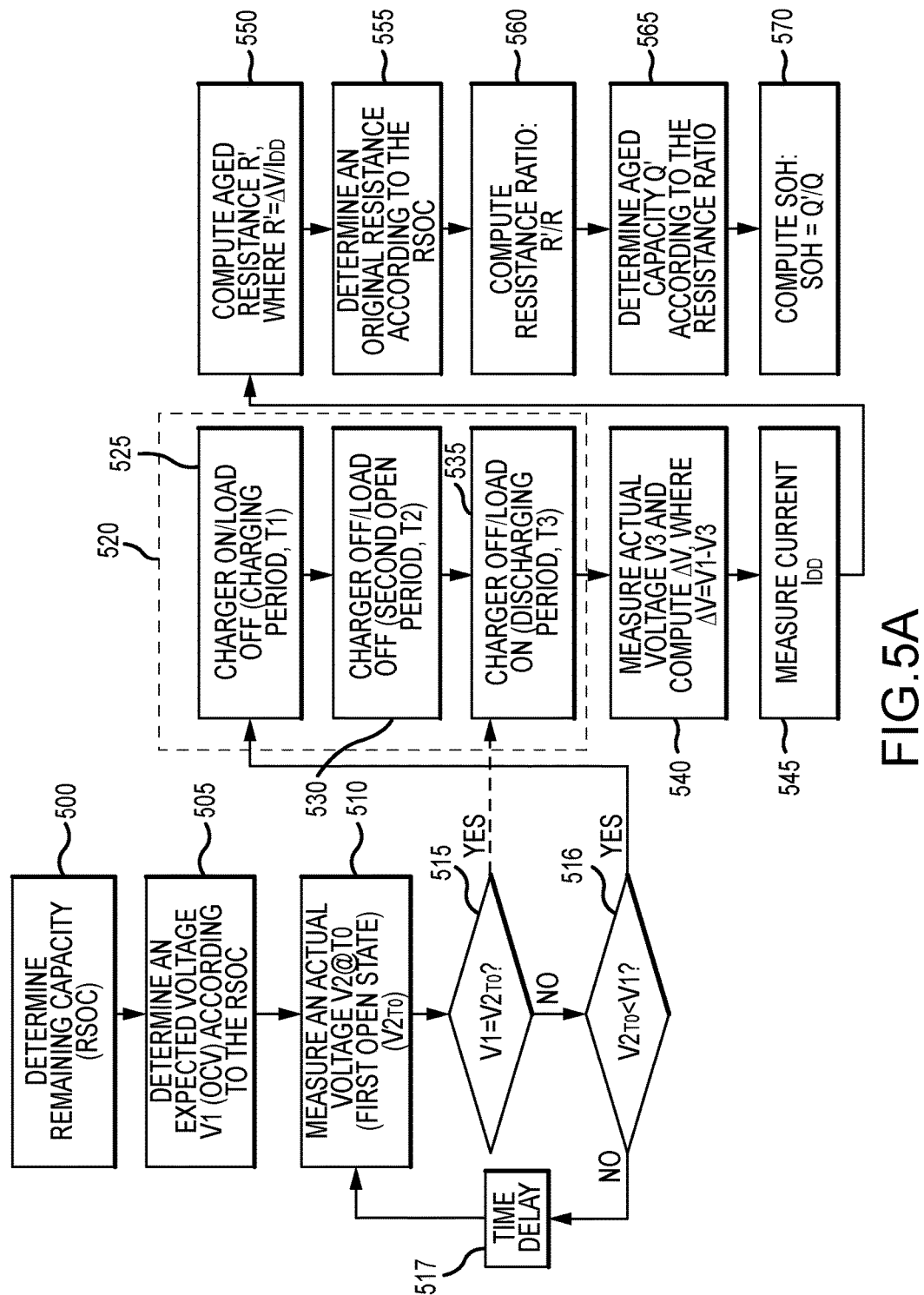
FIG. 5A is a flowchart for obtaining a state of health of a battery in accordance with an exemplary embodiment of the present technology.
Figure 5B:
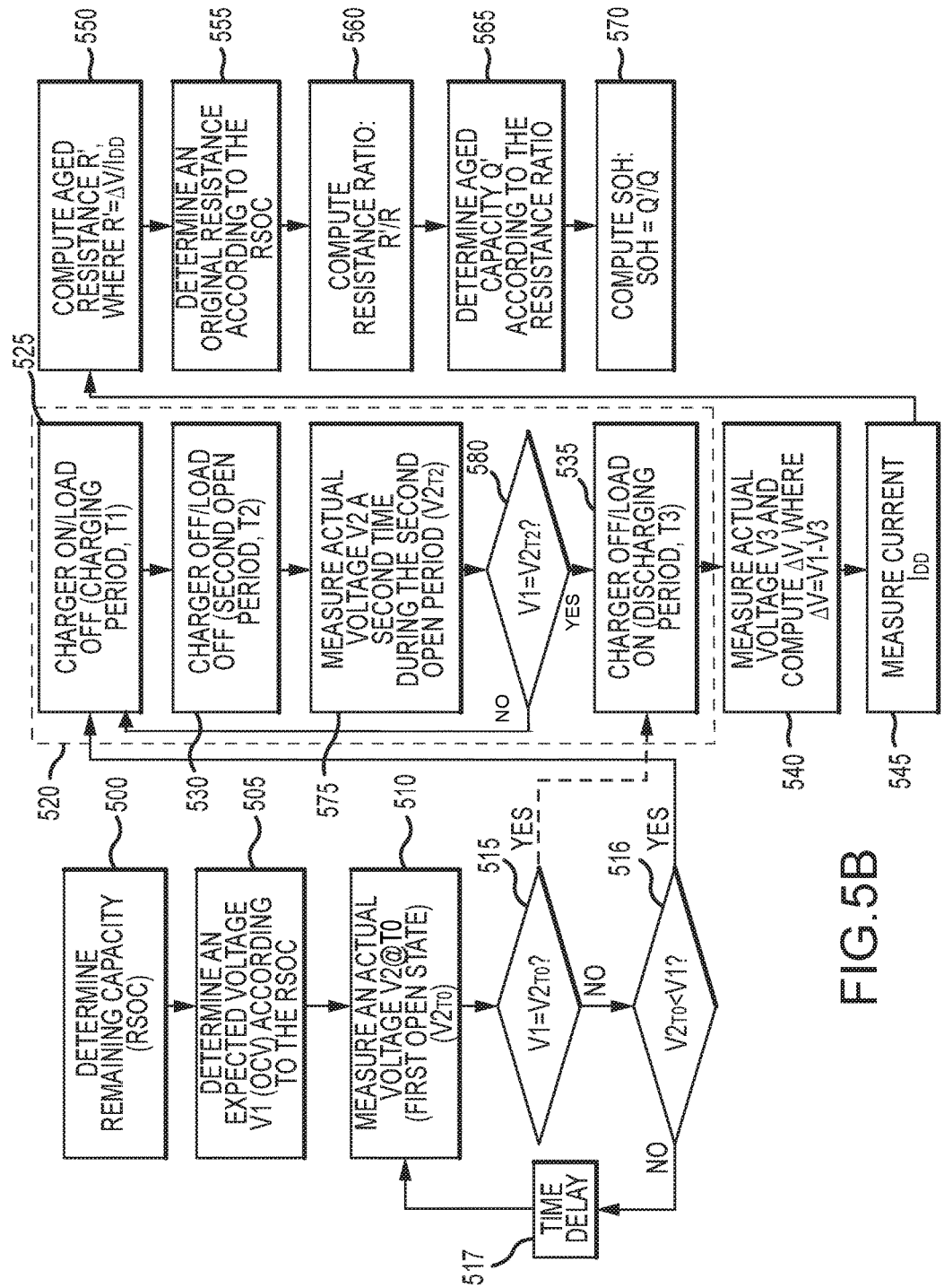
FIG. 5B is an alternative flowchart for obtaining a state of health of a battery in accordance with an exemplary embodiment of the present technology.
Figure 6:
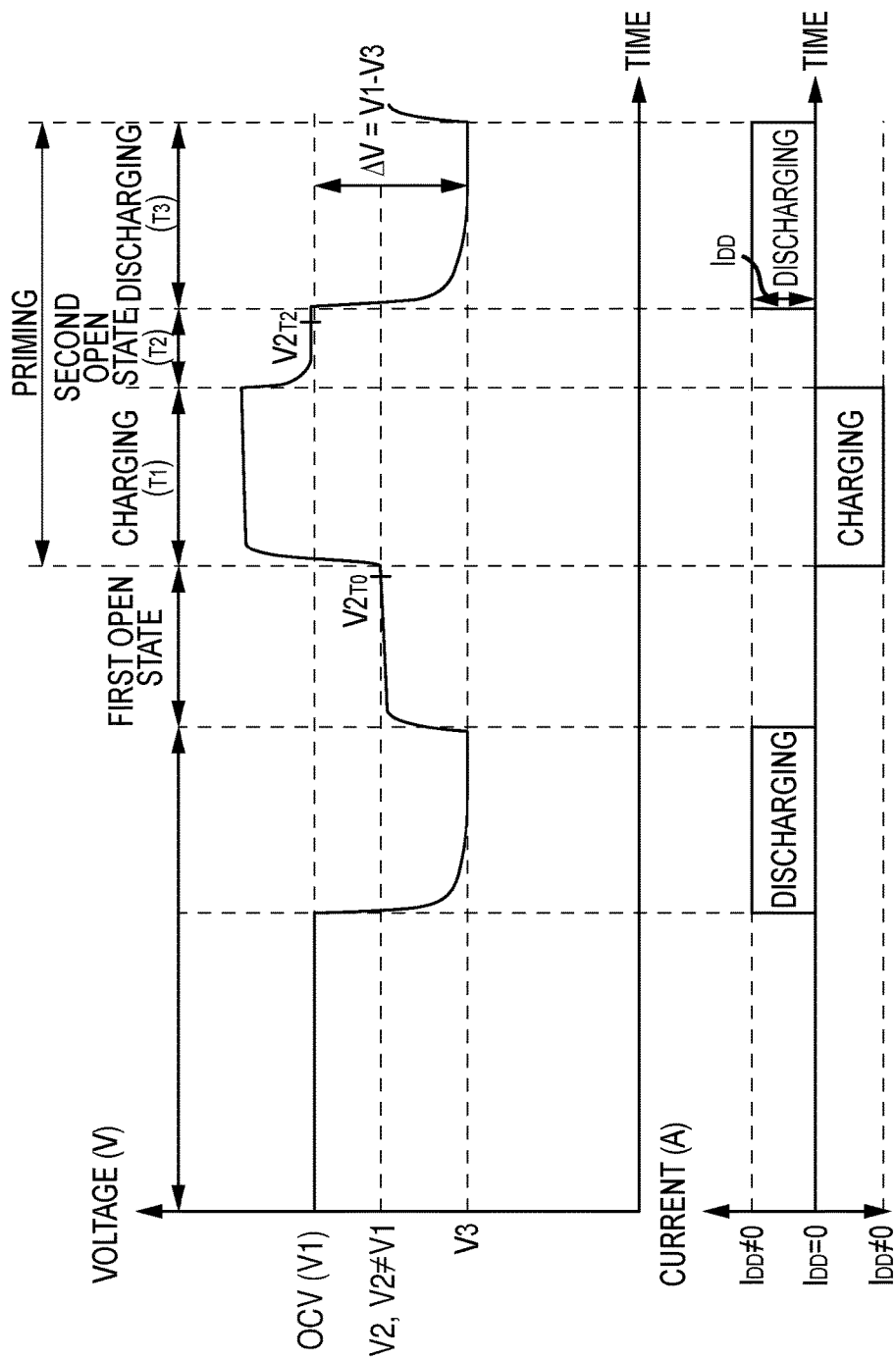
FIG. 6 is a voltage and current waveform of a battery in accordance with an exemplary embodiment of the present technology.

In one embodiment, and referring to FIG. 5B, priming (520) the battery 125 may further comprise measuring the actual voltage V2 again during the open state/second time period ($V2_{T2}$) (575). The actual voltage V2 measured during the second time period T2 may also be referred to as the second voltage at T2 and the second voltage $V2_{T2}$. The fuel gauge circuit 150 may use the logic unit 140 to compare the first voltage V1 to the second voltage $V2_{T2}$ to determine if they are equal (580). If the first voltage V1 is not equal to the second voltage $V2_{T2}$, then the fuel gauge circuit 150 may initiate another charging period (525), another open period (530), and measure the second voltage $V2_{T2}$ again (575). The fuel gauge circuit 150 may continue this loop until the first voltage V1 equals the second voltage $V2_{T2}$. If the first voltage V1 is equal to the second voltage $V2_{T2}$, then the fuel gauge circuit 150 may initiate the discharging period (535), measure the third voltage V3, and continue to compute the relevant variables to determine the SOH of the battery 125.

In an exemplary operation, the charging period, the second open state, and the discharging period are performed sequentially, and the length of time for each period T1, T2, T3 may be predetermined (preset) according to various factors, such as the particular application, battery capacity, power consumption limitations, and/or other suitable factors. It is assumed that the charging period raises the voltage of the battery 125 above the OCV (V1). Since it is observed that during the open state, the voltage returns to the OCV within a relatively short period of time, when the battery 125 is discharged during the discharge period, the voltage drop (ΔV) represents a drop from the OCV. If the voltage drop is measured from a reference voltage other than the OCV, the aged resistance R' will be inaccurate and therefore subsequent calculations that utilize the aged resistance R' will also be inaccurate.

The control circuit 180, the logic unit 140, and/or the timing unit may operate in conjunction with each other to facilitate charging, discharging, and relaxing. For example, the control circuit 180, the logic unit 140, and/or the timing unit may operate in conjunction to generate the first and second control signals S1, S2 at the appropriate times and transmit the generated first and second control signals S1, S2 to operate (open/close) the first and second switches 130, 135 accordingly. The particular timing of the first and second control signals S1, S2 and operation of the first and second switches 130, 135 may be based on the particular application, battery capacity, power consumption limitations, and other relevant factors.

The fuel gauge circuit 150 may then compute the aged resistance R' (550). For example, the logic unit 140 may receive the measured voltage $V_b$ and current $I_{DD}$ either via direct reception from the respective detection circuit (e.g., the voltage detection circuit 160 and the current detection circuit 165) or via the memory 145. The logic unit 140 may utilize the measured voltage $V_b$ and current $I_{DD}$ to compute the aged resistance R' according to Eq. 1 above. In various embodiments, the fuel gauge circuit 150 may utilize the aged resistance value R' to compute various parameters related to the battery 125. For example, the fuel gauge circuit 150 may compute the resistance ratio based on the aged resistance value R'. The fuel gauge circuit 150 may then utilize the resistance ratio to perform subsequent computations, such as the aged capacity Q' and the SOH value. In various embodiments, the fuel gauge circuit 150 may employ the logic unit 140 to retrieve battery characteristic data, such as the original resistance and original capacity.

The fuel gauge circuit 150 may then compute the resistance ratio (560). For example, the logic unit 140 may utilize the aged resistance R' and the original resistance R (extracted according to step 555 and described above) to compute the aged resistance ratio B' according to Eq. 2.

The fuel gauge circuit 150 may then determine the aged capacity Q' according to the resistance ratio (565). For example, the logic unit 140 may extract the aged capacity Q' corresponding to the resistance ratio from the memory 145 using data points, such as data illustrated in FIG. 4.

The fuel gauge circuit 150 may then compute the SOH value according to the aged capacity Q' (570). For example, the logic unit 140 may extract the original capacity Q of the battery 125 from the memory 145 and compute the SOH value according to Eq. 3. In general, the aged capacity Q' is less than the original capacity Q since the original (full charge) capacity of the battery 125 decreases with age.

According to various embodiments, the fuel gauge circuit 150 may transmit the SOH value to the application processor 115, wherein the application processor 115 may provide an alert or appropriate notification to the user. For example, the application processor 115 may convert the SOH value to a corresponding indicator and/or any suitable parameter of the health of battery 125, such as "excellent," "average," "poor," "malfunctioning," or the like. The application processor 115 may further notify the user, via a display screen (not shown) and/or an audio component (not shown), to replace the battery 125 if the SOH value falls below a predetermined value. The parameters (indicators) corresponding to a particular SOH value may be based on the specifications of the battery 125, such as the full charge capacity, temperature, operating specifications, number of charge/discharge cycles, and the like.

In various embodiments, the fuel gauge circuit 150 may measure the relevant data points and compute the SOH value according to a predetermined health check schedule. The health check schedule may be based on the particular application of the battery 125, such as a cell phone or automobile, the battery specifications, and/or any other suitable parameters. For example, in the case of a battery-powered automobile, the fuel gauge circuit 150 may perform the health check every 6 months.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for determining a state of health of a battery selectively coupled to a charger and a load, comprising:
   a fuel gauge circuit, coupled to the battery and communicatively coupled to the charger and the load, configured to:
      measure a remaining capacity of the battery during a first open state;
      determine a first voltage according to the remaining capacity;
      prime the battery by sequentially:
         charging the battery during a first time period by selectively coupling the charger to the battery;
         creating a second open state during a second time period by disconnecting both the charger and the load from the battery; and
         discharging the battery during a third time period by selectively coupling the load to the battery;
      measure a voltage change from the first voltage during the third time period;
      compute an aged resistance based on the change in voltage; and
      compute the state of health of the battery based on the aged resistance and a set of battery characteristic data.

2. The apparatus according to claim 1, wherein the fuel gauge circuit is further configured to prime the battery by:
   measuring an actual voltage during the second open state; and
   comparing the actual voltage with the first voltage, during the second open state.

3. The apparatus according to claim 1, wherein the fuel gauge circuit is further configured to:
   measure a second voltage during the first open state; and
   measure a third voltage during the third time period.

4. The apparatus according to claim 3, wherein the change in voltage is the difference between the first voltage and the third voltage.

5. The apparatus according to claim 3, wherein:
   the fuel gauge circuit is further configured to compare the first voltage and the second voltage; and
   the fuel gauge primes the battery if the first voltage is greater than the second voltage.

6. The apparatus according to claim 1, wherein the set of battery characteristic data comprises:
   a relationship between an original resistance and the remaining capacity; and
   an original capacity.

7. The apparatus according to claim 1, wherein the fuel gauge circuit is further configured to:
   measure a current through the battery during the third time period; and
   compute the aged resistance by dividing the change in voltage by the measured current.

8. The apparatus according to claim 1, wherein the fuel gauge circuit is further configured to:
   compute a resistance ratio, wherein the resistance ratio is equal to the aged resistance divided by an original resistance;
   determine an aged capacity based on the computed resistance ratio; and
   compute the state of health based on the aged capacity and an original capacity.

9. A method for determining a state of health of a battery selectively coupled to a charger and a load, comprising:
   measuring a remaining capacity during a first open state;
   determining an expected battery voltage according to the measured remaining capacity;
   priming the battery by sequentially:
      charging the battery during a first time period;
      creating a second open state during a second time period by disconnecting both the charger and the load from the battery; and
      discharging the battery during a third time period;
   measuring a voltage change from the expected battery voltage during the third time period;
   computing an aged resistance based on the measured change in voltage; and
   computing the state of health of the battery based on the computed aged resistance and a set of battery characteristic data.

10. The method for determining a state of health of a battery according to claim 9, wherein priming the battery further comprises:
   measuring an actual battery voltage during the second open state; and
   comparing the actual voltage with the expected voltage, during the second open state.

11. The method for determining a state of health of a battery according to claim 9, further comprising:
   measuring a current through the battery during the third time period;
   computing a resistance ratio based on the aged resistance; and
   determining an aged capacity based on the resistance ratio.

12. The method for determining a state of health of a battery according to claim 11 wherein computing the state of health of the battery comprises dividing the aged capacity by an original capacity.

13. The method for determining a state of health of a battery according to claim 9, wherein the set of battery characteristic data comprises:
   an original resistance versus remaining capacity; and
   an original capacity.

14. The method for determining a state of health of a battery according to claim 9, further comprising:
   measuring a second battery voltage during the first open state;
   comparing the expected battery voltage and the second battery voltage; and
   priming the battery if the second battery voltage is less than the expected battery voltage.

15. A system capable of monitoring a battery and battery characteristics, comprising:
   a switchable charger configured to be selectively coupled to the battery;
   a switchable load configured to be selectively coupled to the battery;

a fuel gauge circuit, configured to be coupled to the battery, and communicatively coupled to the switchable charger and the switchable load, wherein the fuel gauge circuit is configured to:
measure a remaining capacity of the battery during a first open state;
determine expected battery characteristic data according to the measured remaining capacity;
prime the battery by sequentially:
  charging the battery during a first time period by selectively coupling the charger to the battery;
  creating a second open state during a second time period by disconnecting both the charger and the load from the battery; and
  discharging the battery during a third time period by selectively coupling the load to the battery;
determine a change in voltage of the battery based on at least a portion of the expected battery characteristic data;
measure a current during the third time period;
compute an aged resistance of the battery according to the determined change in voltage and the measured current;
compute a resistance ratio according to the aged resistance;
determine an aged capacity based on the computed resistance ratio;
compute a state of health value based on the computed aged capacity and an original capacity.

16. The system according to claim 15, wherein the expected battery characteristic data comprises:
an expected first voltage; and
an original resistance.

17. The system according to claim 16, wherein the fuel gauge circuit is further configured to:
measure an actual second voltage during the first open state;
compare the expected first voltage and the actual second voltage;
prime the battery if the actual second voltage is less than the expected first voltage;
measure an actual third voltage during the third time period; and
measure a current through the battery during the third time period.

18. The system according to claim 16, wherein:
the resistance ratio is equal to the aged resistance divided by the original resistance; and
the state of health value is equal to the aged capacity divided by the original capacity.

19. The system according to claim 16, wherein the fuel gauge circuit is further configured to prime the battery by:
measuring an actual voltage during the second open state; and
comparing the measured actual voltage with the expected first voltage.

20. The system according to claim 15, wherein the first, second, and third time periods are predetermined.

* * * * *